US012564069B2

(12) United States Patent
Uchida et al.

(10) Patent No.: US 12,564,069 B2
(45) Date of Patent: Feb. 24, 2026

(54) SEMICONDUCTOR APPARATUS, AUTHENTICITY DETERMINATION METHOD AND POWER CONVERSION APPARATUS

(71) Applicant: Mitsubishi Electric Corporation, Tokyo (JP)

(72) Inventors: Yoshihisa Uchida, Tokyo (JP); Tatsunori Yanagimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 18/331,575

(22) Filed: Jun. 8, 2023

(65) Prior Publication Data

US 2024/0178153 A1 May 30, 2024

(30) Foreign Application Priority Data

Nov. 24, 2022 (JP) ................................. 2022-187600

(51) Int. Cl.
| | |
|---|---|
| *G06K 7/08* | (2006.01) |
| *G06K 7/10* | (2006.01) |
| *H01L 23/053* | (2006.01) |
| *H01L 23/31* | (2006.01) |
| *H01L 23/495* | (2006.01) |

(Continued)

(52) U.S. Cl.
CPC ........ *H01L 23/544* (2013.01); *G06K 7/10366* (2013.01); *H01L 23/053* (2013.01); *H01L 23/3121* (2013.01); *H01L 23/495* (2013.01); *H01L 24/48* (2013.01); *H01L 2223/54446* (2013.01); *H01L 2224/4813* (2013.01); *H01L 2224/48227* (2013.01); *H01L 2224/48245* (2013.01)

(58) Field of Classification Search
CPC .......... G06K 7/10366; G06K 19/0723; G06K 19/07749; H01L 23/53295; H01L 23/051; H01L 23/053; H01L 23/3121; H01L 23/481; H01L 23/495
USPC ................ 235/251, 387, 482, 451, 487, 492
See application file for complete search history.

(56) References Cited

U.S. PATENT DOCUMENTS

| | | | |
|---|---|---|---|
| 2006/0213988 A1 | 9/2006 | Wang | |
| 2007/0004102 A1* | 1/2007 | Dairiki ............... | H10D 86/0214 |
| | | | 438/149 |

(Continued)

FOREIGN PATENT DOCUMENTS

| | | | | |
|---|---|---|---|---|
| JP | H1159040 | * | 3/1999 | ... H01L 2224/48091 |
| JP | 2004179234 | * | 6/2004 | .... H01L 2924/15311 |
| JP | 2005241629 | * | 9/2005 | ........... H01L 21/336 |
| JP | 2006108256 | * | 4/2006 | ..... H01L 2224/0603 |

(Continued)

OTHER PUBLICATIONS

"Notice of Reasons for Refusal" Office Action issued in JP 2022-187600; mailed by the Japanese Patent Office on Aug. 19, 2025.

(Continued)

*Primary Examiner* — Daniel St Cyr
(74) *Attorney, Agent, or Firm* — Studebaker Brackett PLLC

(57) ABSTRACT

According to the present disclosure, a semiconductor apparatus comprises a housing a semiconductor chip installed in the housing, and a first radio tag installed on the housing. The first radio tag is installed in a state where rewriting from outside is not limited.

18 Claims, 4 Drawing Sheets

(51) Int. Cl.
　　*H01L 23/544*　　　(2006.01)
　　*H01L 23/00*　　　(2006.01)

(56)　　　　　References Cited

U.S. PATENT DOCUMENTS

| 2008/0121819 | A1* | 5/2008 | Tanaka | B23K 26/042 |
| | | | | 438/22 |
| 2008/0138701 | A1* | 6/2008 | Kuboki | H01M 6/40 |
| | | | | 429/129 |
| 2008/0217563 | A1* | 9/2008 | Kato | H01L 27/1266 |
| | | | | 257/E27.113 |
| 2011/0254095 | A1* | 10/2011 | Kamata | H10D 86/60 |
| | | | | 257/E27.06 |
| 2015/0221774 | A1* | 8/2015 | Yamazaki | H10D 30/6757 |
| | | | | 257/43 |

FOREIGN PATENT DOCUMENTS

| JP | 2007-018353 | A | 1/2007 | |
| JP | 2007-73739 | A | 3/2007 | |
| JP | 2016-522987 | A | 8/2016 | |
| JP | 2018-073923 | A | 5/2018 | |
| JP | 2019-020518 | A | 2/2019 | |
| JP | 2022-150829 | A | 10/2022 | |
| WO | 2014/173550 | A1 | 10/2014 | |
| WO | 2014173550 | * | 10/2014 | .......... H01L 25/165 |

OTHER PUBLICATIONS

An Office Action, "Decision of Refusal," mailed by the Japanese Patent Office on Dec. 9, 2025, which corresponds to Japanese Patent Application No. 2022-187600 and is related to U.S. Appl. No. 18/331,575; with English language translation.

* cited by examiner

100

102

104

9  8-2  11  8-2  4-2  4-1  4  10  8-1  7

1  1-2  2-2  5  6  3  2-1  2-2  2-3  2

106

1-1b 9  8-2  11  8-2  4-2  4-1  4  10  8-1  7

1  1-2  2-2  5  6  3  2-1  2-2  2-3  2

112

114

SEMICONDUCTOR APPARATUS, AUTHENTICITY DETERMINATION METHOD AND POWER CONVERSION APPARATUS

BACKGROUND OF THE INVENTION

Field

The present disclosure relates to a semiconductor apparatus, an authenticity determination method and a power conversion apparatus.

Background

There is a technique for displaying individual identification information on the outside of a semiconductor apparatus for individual management. The individual identification information is displayed by direct printing of characters or attachment of a label. However, when the semiconductor apparatus is incorporated in a power conversion apparatus or the like, the printed characters or the label cannot be checked from the outside, which causes an issue that visual individual identification cannot be performed. Further, if the printed characters disappear or the label is detached, an issue that the individual identification becomes impossible occurs.

To solve the above-described issues, JP 2007-18353 A discloses a method of mounting a radio tag storing individual identification information on a power semiconductor apparatus. Further, Patent Literature 1 discloses a method of recording, in the radio tag, information at the time of manufacturing of the power semiconductor apparatus. This makes it possible to check the used members and manufacturing history of the power semiconductor apparatus, only from the information recorded in the radio tag.

However, in the above-described methods, the radio tag is used only for checking the individual identification information and the manufacturing history of the semiconductor apparatus. In other words, there is an issue that the radio tag is not utilized for individual management or progress management in a manufacturing process of a unit incorporating the semiconductor apparatus or of a final product mounted with the unit.

SUMMARY

In view of the above-described problems, an object of the present disclosure is to provide a semiconductor apparatus, an authenticity determination method and a power conversion apparatus that can utilize a radio tag for individual management and progress management in a manufacturing process of a unit incorporating the semiconductor apparatus or of a final product mounted with the unit.

The features and advantages of the present disclosure may be summarized as follows.

A semiconductor apparatus according to the present disclosure includes: a housing: a semiconductor chip installed in the housing: and a first radio tag installed on the housing, the first radio tag being installed in a state where rewriting from outside is not limited.

Other and further objects, features and advantages of the disclosure will appear more fully from the following description.

DESCRIPTION OF EMBODIMENT

First Embodiment

Figure 1:
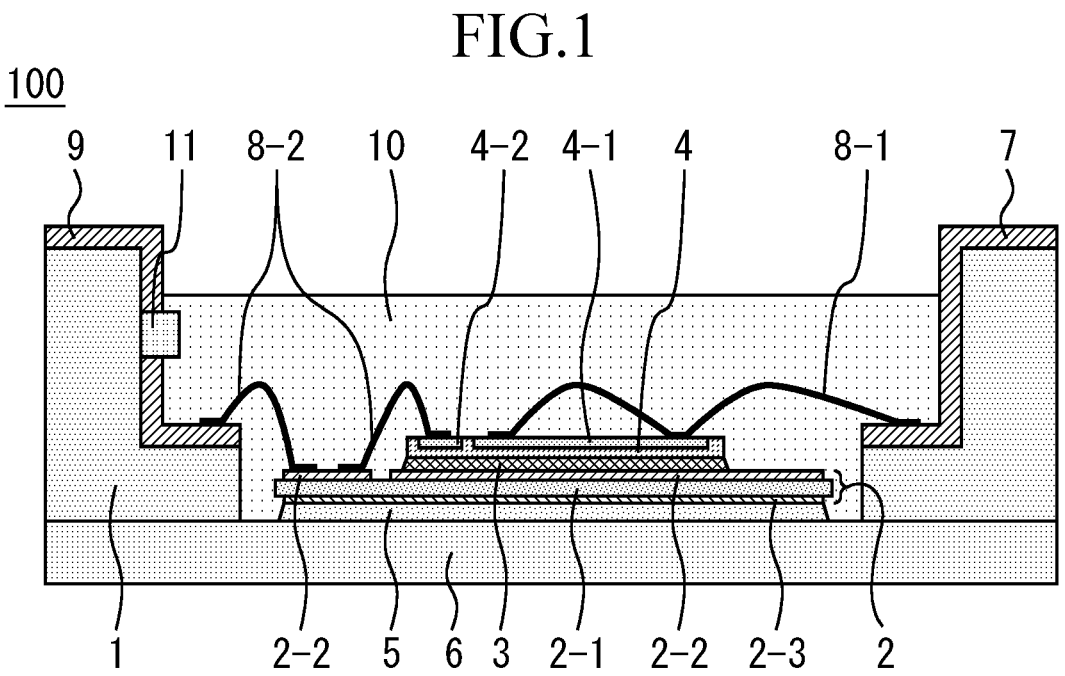
FIG. 1 is a cross-sectional view illustrating a semiconductor apparatus according to a first embodiment of the present disclosure.

FIG. 1 is a cross-sectional view illustrating a semiconductor apparatus according to a first embodiment of the present disclosure. A semiconductor apparatus 100 is a power semiconductor apparatus, and includes a housing 1. The housing 1 is mainly made of, for example, a poly phenylene sulfide (PPS) resin. Alternatively, the housing 1 may be made of a material that can obtain desired characteristics such as electric insulation property and heat resistance, such as a poly ethylene terephthalate (PET) resin and a poly butylene terephthalate (PBT) resin.

The housing 1 is provided so as to surround an insulation substrate 2. The insulation substrate 2 includes an insulation layer 2-1. The insulation layer 2-1 is mainly made of, for example, ceramics. A circuit pattern 2-2 is formed on a front surface of the insulation layer 2-1. The circuit pattern 2-2 is mainly made of, for example, Cu. Further, a circuit pattern 2-3 is formed on a rear surface of the insulation layer 2-1. The circuit pattern 2-3 is mainly made of, for example, Cu.

Note that it is sufficient for the insulation layer 2-1 to secure insulation performance between the circuit pattern 2-2 on the front surface and the circuit pattern 2-3 on the rear surface. In other words, the main material may be an insulation resin or the like. Further, it is sufficient for the circuit pattern 2-2 and the circuit pattern 2-3 to secure desired electric conductivity, desired heat conductivity, and bonding property with a chip bonding material 3 and a substrate bonding material 5 described below. For example, A1 may be used as the main material, and the surface may be subjected to plating treatment.

A semiconductor chip 4 is joined onto the circuit pattern 2-2 through the chip bonding material 3. The chip bonding material is, for example, solder. Alternatively, the chip bonding material may be a material that can obtain desired performance such as bonding strength and bonding reliability, for example, a bonding material containing a sinterable metal filler, an electroconductive adhesive, or a liquid-phase diffusing agent.

The semiconductor chip 4 is a power semiconductor chip, for example, an insulated gate bipolar transistor (IGBT) containing Si as a base material. Alternatively, the semiconductor chip 4 may be a free wheel diode (FWD), a metal oxide semiconductor field effect transistor (MOSFET), or the like, and a plurality of types of semiconductor chips 4 may be mounted.

Further, a semiconductor material having a band gap greater than a band gap of existing Si, such as a silicon carbide (SiC) material, a gallium nitride (GaN) material, and diamond may be used.

The circuit pattern 2-3 is joined to a base plate 6 through the substrate bonding material 5. The substrate bonding material 5 is, for example, solder.

The housing 1 holds a part of a main terminal 7. The main terminal 7 is a terminal through which main current flows. One end of the main terminal 7 is connected to a main electrode 4-1 by a main wire 8-1. The main wire 8-1 is a metal wire mainly made of, for example, A1. The main electrode 4-1 is formed on a surface of the semiconductor chip 4, and inputs/outputs the main current. The other end of the main terminal 7 is exposed from the housing 1.

The housing 1 holds a part of a signal terminal 9. The signal terminal 9 is a terminal through which a control signal flows. One end of the signal terminal 9 is connected to a signal electrode 4-2 by a signal wire 8-2. The signal wire 8-2 is a metal wire mainly made of, for example, A1. The signal electrode 4-2 is formed on the surface of the semiconductor chip 4, and inputs/outputs the control signal or a sense signal. The other end of the signal terminal 9 is exposed from the housing 1.

An inside of the housing 1 is filled with a sealing material 10. The sealing material 10 is made of, for example, silicone gel. Alternatively, the sealing material 10 may be made of a material functioning as a sealing material, such as an epoxy resin. At least parts of the insulation substrate 2, the semiconductor chip 4, the main wire 8-1, and the signal wire 8-2 are sealed with the sealing material 10. In other words, the above-described members are protected by the sealing material 10.

The housing 1 further includes a radio tag 11 as a first radio tag. The radio tag 11 is attached to a position closer to the signal terminal 9 than the main terminal 7 on an inner wall of the housing 1 by, for example, an insulation adhesive. Note that an installation position of the radio tag 11 may be a position other than the inner wall of the housing 1, and is described in detail in modifications described below.

The radio tag 11 is, for example, an RFID. The radio tag 11 performs radio communication using electromagnetic waves or electric waves by using a radio tag reader and a radio tag writer. As a result, information written in the radio tag 11 can be read in a non-contact manner by using the radio tag reader, and information can be written or rewritten into the radio tag 11 by using the radio tag writer. Further, the radio tag 11 has a function of limiting rewriting of the written tag information by password lock. The radio tag reader also has a function of collectively reading tag information of a plurality of radio tags within a communicable area.

In the present embodiment, the case where the insulation substrate 2 is joined to the base plate 6 is described; however, the base plate 6 may be omitted, and the circuit pattern 2-3 of the insulation substrate 2 may be exposed.

Further, in the present embodiment, the case where the main electrode 4-1 and the main terminal 7 are connected to each other by the main wire 8-1 mainly made of A1 is described; however, the main electrode 4-1 and the main terminal 7 are connected to each other by the main wire 8-1 mainly made of Cu. Furthermore, the one end of the main terminal 7 may be arranged just above the main electrode 4-1, and the one end of the main terminal 7 and the main electrode 4-1 may be joined to each other through solder or the like, or through the circuit pattern 2-2. In other words, the method of connecting the main electrode 4-1 and the main terminal 7, and the material used for the connection are not limited. The method of connecting the signal electrode 4-2 and the signal terminal 9, and the material used for the connection are also not limited.

The tag information of the radio tag 11 may be lost or the radio tag 11 itself may be damaged by high temperature or temperature change. In the semiconductor apparatus, a path of the main current centered on the semiconductor chip 4 generates heat during operation of the semiconductor apparatus. More specifically, the circuit pattern 2-2, the semiconductor chip 4, the main terminal 7, and the main wire 8-1 serve as heat generators. Therefore, in a case where the radio tag 11 is installed near any of the heat generators, the information of the radio tag 11 may be lost or the radio tag 11 may be damaged.

Therefore, as described above, the radio tag 11 is kept away from the above-described heat generators by being installed on the housing 1. In particular, the radio tag 11 is kept further away from the above-described heat generators by being attached to the position closer to the signal terminal 9 than the main terminal 7. This makes it possible to suppress temperature change by heat generation, and to prevent loss of the information or damage of the radio tag 11.

Further, since the radio tag 11 is mounted on the housing 1, the tag information of the radio tag 11 can be rewritten from the outside. Therefore, the radio tag 11 can be utilized not only for individual management of the semiconductor apparatus but also for management of a unit such as a power conversion apparatus incorporating the semiconductor apparatus. The power conversion apparatus is, for example, an inverter or a converter. Examples of the management include manufacturing process management, individual management, and logistics management.

Likewise, the radio tag 11 can also be utilized for management of a final product mounted with the unit. The final product is, for example, a home electric appliance, an elevator, and an electric vehicle.

The radio tag 11 is attached to the housing 1 in a state where the tag information can be rewritten by the radio tag writer. In other words, the radio tag 11 is attached in a state where rewriting is not locked by a password.

An existing radio tag 11 finishes its role at a time when the semiconductor apparatus is incorporated in the unit except for a case where the individual identification information of the power semiconductor apparatus is necessary because of a malfunction or the like. In contrast, rewriting of the tag information of the radio tag 11 according to the present embodiment is not limited. Therefore, the radio tag 11 can be utilized for management of the semiconductor apparatus, the unit incorporating the semiconductor apparatus, and the final product mounted with the unit, by rewriting the tag information.

Utilization examples of the radio tag 11 are described below. First, a utilization example relating to individual management of the semiconductor apparatus is described. There is a utilization method of writing an inspection result in the radio tag 11 provided in the semiconductor apparatus at the time of final inspection before shipment and checking the tag information at the time of shipment. This makes it possible to prevent erroneous shipment of an inspection rejected product.

Further, the radio tag 11 can be utilized when a plurality of types of semiconductor apparatuses that have the same outer shape but is different in internal structure are incorporated in an inverter or the like. For example, a mounting position, an assembling order, or the like of each semiconductor apparatus is previously written in the radio tag 11 provided in each semiconductor apparatus. At the time of assembly, the semiconductor apparatuses are mounted based on the tag information. In the case of the existing semiconductor apparatus, the individual is identified by reading the printed characters or the label. Therefore, a selection mistake caused by reading error occurs. In contrast, such reading error does not occur in this method. Therefore, it is possible to prevent a mounting mistake.

Next, a utilization example relating to individual management of the unit incorporating the semiconductor apparatus is described. First, after the semiconductor apparatus according to the present disclosure is incorporated in the inverter, the tag information of the radio tag 11 is rewritten with individual identification information of the inverter or the like. As a result, the radio tag 11 can be utilized for manufacturing process management, individual management, and logistics management of the inverter. As a first example, there is a method of utilizing the radio tag 11 for simple individual management by rewriting the tag information of the radio tag 11 with an individual identification number of the inverter. As a second example, there is a method of utilizing the radio tag 11 for manufacturing history management by sequentially writing used members or step progress during manufacture of the inverter, in the radio tag 11. As a third example, there is a method of preventing erroneous shipment of the inspection rejected product by sequentially writing an inspection result about appearance or performance in or after the manufacturing process of the inverter, in the radio tag 11. As a result, the radio tag 11 can be utilized for shipment management or logistics trace of the inverter.

As in the above-described examples, the radio tag 11 can be utilized in various cases. In a case where the radio tag 11 is used for individual management of the inverter, it is sufficient to mount at least one semiconductor apparatus according to the present disclosure on the inverter.

Further, as for the final product mounted with the unit incorporating the semiconductor apparatus, utilization methods similar to the case of the unit are considered. In other words, the radio tag 11 can be utilized for management of the final product by rewriting the tag information with individual identification information or the like on the final product.

Figure 2:
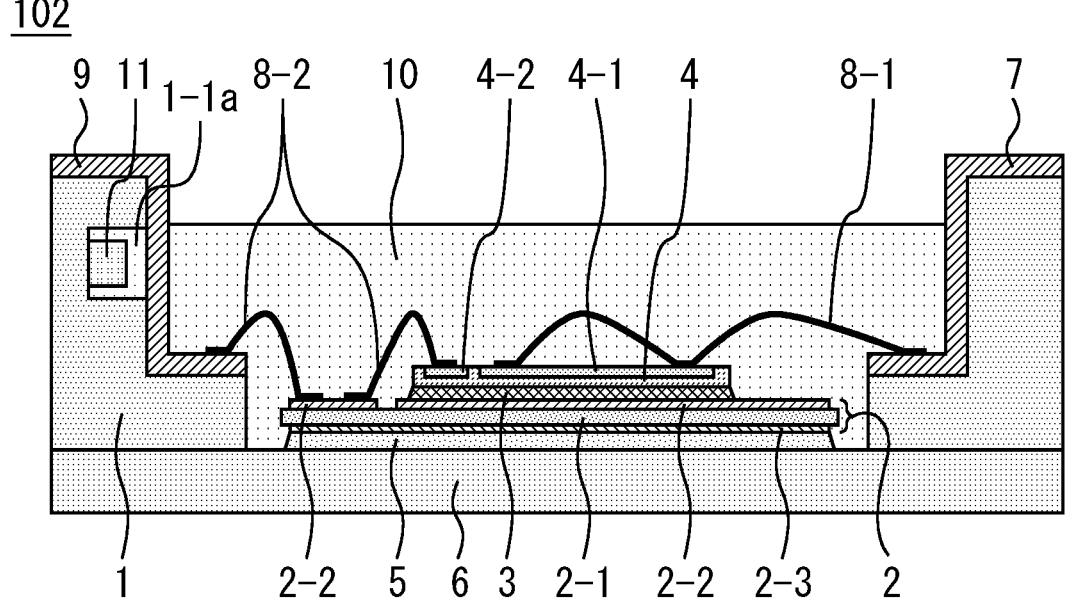
FIG. 2 is a cross-sectional view illustrating a first modification of the semiconductor apparatus according to the first embodiment of the present disclosure.

FIG. 2 is a cross-sectional view illustrating a first modification of the semiconductor apparatus according to the first embodiment of the present disclosure. A semiconductor apparatus 102 is different from the semiconductor apparatus according to the first embodiment in that the radio tag 11 is provided in a radio tag mounting portion formed in the inner wall of the housing 1.

The semiconductor apparatus 102 includes the housing 1. The housing 1 includes, in the inner wall, a radio tag mounting portion 1-1a that is a first radio tag mounting portion having a recessed hole shape. The radio tag mounting portion 1-1a is arranged at a position closer to the signal terminal 9 than the main terminal 7. The radio tag 11 is fixed to the inside of the radio tag mounting portion 1-1a by, for example, an insulation tape. Note that the inside of the radio tag mounting portion 1-1a may be filled with an insulation resin or the like.

Figures 3, 4:
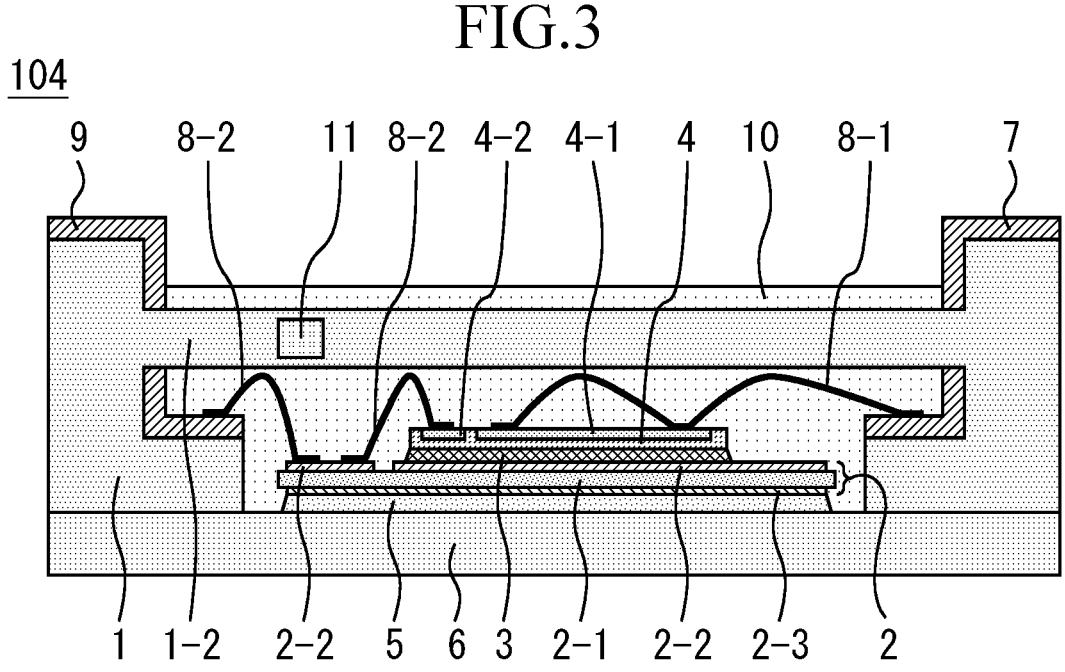
FIG. 3 is a cross-sectional view illustrating a second modification of the semiconductor apparatus according to the first embodiment of the present disclosure.
FIG. 4 is a cross-sectional view illustrating a third modification of the semiconductor apparatus according to the first embodiment of the present disclosure.

FIG. 3 is a cross-sectional view illustrating a second modification of the semiconductor apparatus according to the first embodiment of the present disclosure. A semiconductor apparatus 104 is different from the semiconductor apparatus according to the first embodiment in that the radio tag 11 is provided on a beam formed on the housing 1.

The semiconductor apparatus 104 includes the housing 1. The housing 1 includes a beam 1-2 connecting the inner walls facing each other. The radio tag 11 is fixed onto the beam 1-2 by, for example, an insulation tape. Note that the radio tag 11 is arranged at a position closer to the signal terminal 9 than the main terminal 7.

FIG. 4 is a cross-sectional view illustrating a third modification of the semiconductor apparatus according to the first embodiment of the present disclosure. A semiconductor apparatus 106 is different from the semiconductor apparatus according to the first embodiment in that the radio tag 11 is provided in a radio tag mounting portion formed inside the beam 1-2 of the housing 1.

The semiconductor apparatus 106 includes the housing 1. The housing 1 includes the beam 1-2 connecting the inner walls facing each other. The beam 1-2 includes a radio tag mounting portion 1-1b that is a second radio tag mounting portion at a position closer to the signal terminal 9 than the main terminal 7. The radio tag 11 is fixed to the inside of the radio tag mounting portion 1-1b by, for example, an insulation tape. Note that the inside of the radio tag mounting portion 1-1b may be filled with an insulation resin or the like.

Figure 5:
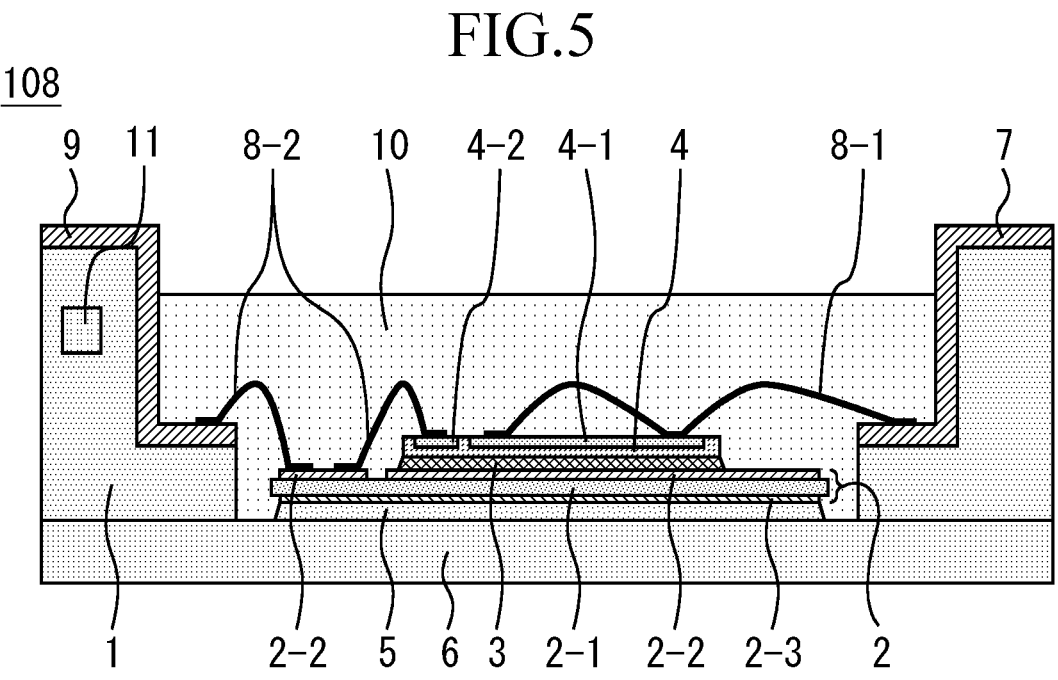
FIG. 5 is a cross-sectional view illustrating a fourth modification of the semiconductor apparatus according to the first embodiment of the present disclosure.

FIG. 5 is a cross-sectional view illustrating a fourth modification of the semiconductor apparatus according to the first embodiment of the present disclosure. A semiconductor apparatus 108 is different from the semiconductor apparatus according to the first embodiment in that the radio tag 11 is provided inside the housing 1.

The semiconductor apparatus 108 includes the housing 1. The housing 1 internally includes the radio tag 11. Note that the radio tag 11 is arranged at a position closer to the signal terminal 9 than the main terminal 7.

The housing 1 internally including the radio tag 11 is fabricated by, for example, insert molding. More specifically, when the main terminal 7 or the signal terminal 9 is arranged in a mold, the radio tag 11 is also arranged, and resin molding is then performed. This makes it possible to install the radio tag 11 without drastically increasing a manufacturing cost. Further, the fabrication has advantages that, for example, a step of mounting the radio tag 11 is unnecessary at assembly of the semiconductor apparatus, and manufacture of a counterfeit product is difficult.

As described above, even in a case where the mounting position and the method of mounting the radio tag 11 are different, the radio tag 11 can be arranged at the position closer to the signal terminal 9 than the main terminal 7 in the housing. This makes it possible to reduce influence of heat generation and temperature change during operation of the semiconductor apparatus, on the radio tag 11.

Second Embodiment

Figure 6:
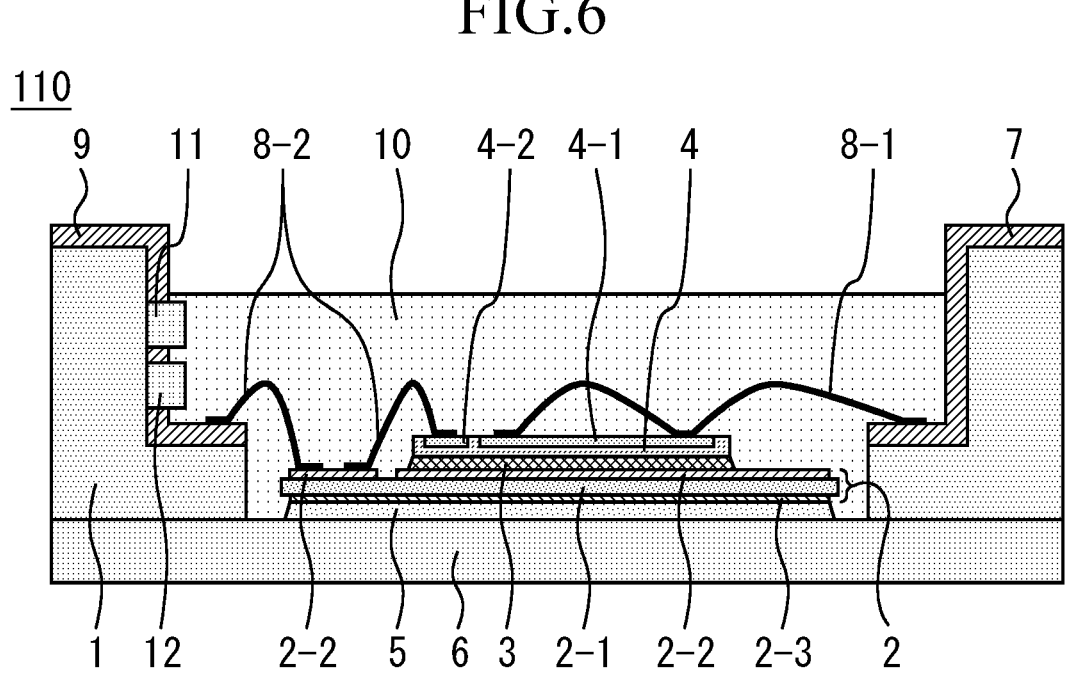
FIG. 6 is a cross-sectional view illustrating a semiconductor apparatus according to a second embodiment of the present disclosure.

FIG. 6 is a cross-sectional view illustrating a semiconductor apparatus according to a second embodiment of the present disclosure. A semiconductor apparatus 110 is different from the semiconductor apparatus according to the first embodiment in that a second radio tag is provided in addition to the first radio tag.

The semiconductor apparatus 110 includes the housing 1. The housing 1 includes a radio tag 12 as the second radio tag in addition to the radio tag 11. The radio tag 12 is attached to a position closer to the signal terminal 9 than the main terminal 7 on the inner wall of the housing 1 by, for example, an insulation adhesive. The radio tag 12 stores the individual identification information of the semiconductor apparatus. Further, rewriting of the tag information of the radio tag 12 is limited by password lock.

As the utilization examples of the radio tag 11 as the first radio tag described in the first embodiment, the methods of rewriting the tag information of the radio tag 11 with information different from the individual identification information of the semiconductor apparatus are described. In this case, individual of the semiconductor apparatus cannot be identified using the radio tag 11. However, if a trouble occurs, the individual identification information of the semiconductor apparatus may become necessary in order to investigate a cause of the trouble or to specify an affected range.

The semiconductor apparatus 110 according to the present embodiment includes the radio tag 12 in addition to the radio tag 11. In other words, even in a case where information other than the individual identification information is recorded in the radio tag 11, the individual identification information can be recorded in the radio tag 12. Accordingly, even in the unit incorporating the semiconductor apparatus 110 or the final product mounted with the unit, the individual identification information can read from the outside by using the radio tag reader. In other words, utilization of the radio tag for management of the unit and the final product mounted with the unit and utilization of the radio tag for individual identification of the semiconductor apparatus itself are both achievable.

Note that, as described in the modifications of the first embodiment, the radio tag 12 may be installed at a mounting position different from the above-described position, or may be installed by a mounting method different from the above-described method, as long as the radio tag 12 is arranged at the position closer to the signal terminal 9 than the main terminal 7 in the housing. This makes it possible to reduce influence of heat generation and temperature change during operation of the semiconductor apparatus, on the radio tag 12.

Third Embodiment

Figure 7:
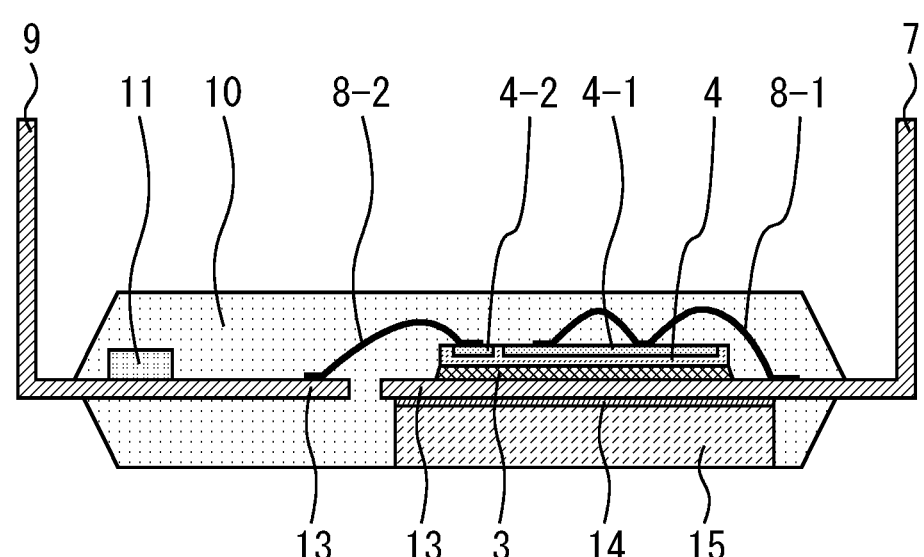
FIG. 7 is a cross-sectional view illustrating a semiconductor apparatus according to a third embodiment of the present disclosure.

FIG. 7 is a cross-sectional view illustrating a semiconductor apparatus according to a third embodiment of the present disclosure. A semiconductor apparatus 112 is different from the semiconductor apparatus according to the first embodiment in that no housing is provided and a metal frame is sealed with a resin.

The semiconductor apparatus 112 includes a metal frame 13. The metal frame 13 can form external terminals by being partially exposed from the sealing material 10. The external terminals are the main terminal 7 and the signal terminal 9. Here, an example of a dual in-line package (DIP) type is described.

The semiconductor chip 4 is joined onto the metal frame 13 through the chip bonding material 3. The main electrode 4-1 formed on the surface of the semiconductor chip 4 is connected to the main terminal 7 by the main wire 8-1. The signal electrode 4-2 formed on the surface of the semiconductor chip 4 is connected to the signal terminal 9 by the signal wire 8-2.

The metal frame 13 further includes a heat spreader 15 on a surface opposed to the semiconductor chip 4 through an insulation sheet 14. The heat spreader 15 is made of, for example, Cu.

The metal frame 13 further includes the radio tag 11. The radio tag 11 is attached to a position closer to the signal terminal 9 than the main terminal 7 on a surface of the metal frame 13 by, for example, an insulation adhesive.

An inside and an outside of the metal frame 13 are filled with the sealing material 10 made of an insulation resin. At least parts of the semiconductor chip 4 and the radio tag 11 are sealed with the sealing material 10. In other words, the above-described members are protected by the sealing material 10.

As described above, the radio tag 11 is attached to the position closer to the signal terminal 9 than the main terminal 7, on the metal frame 13. The tag information of the radio tag 11 may be lost or the radio tag 11 itself may be damaged by high temperature or temperature change. However, in the semiconductor apparatus, the path of the main current centered on the semiconductor chip 4 generates heat during operation of the semiconductor apparatus. More specifically, the semiconductor chip 4, the main terminal 7, the main wire 8-1, and the metal frame 13 on the main terminal 7 side serve as heat generators. Therefore, the radio tag 11 is kept away from the above-described heat generators by being attached on the signal terminal 9 side of the metal frame 13. This makes it possible to suppress temperature change by heat generation, and to prevent loss of the information or damage of the radio tag 11.

In the present embodiment, the semiconductor apparatus 112 mounted with the heat spreader 15 through the insulation sheet 14 is described. Alternatively, a heatsink mainly made of Al may be used. Alternatively, the heat spreader 15 is omitted, and the insulation sheet 14 including a metal foil or the like may be used. Further, the insulation property may be secured only by the sealing material 10 on a rear surface of the metal frame 13. Moreover, in the third embodiment, the radio tag 12 described in the second embodiment may be provided.

Fourth Embodiment

Figure 8:
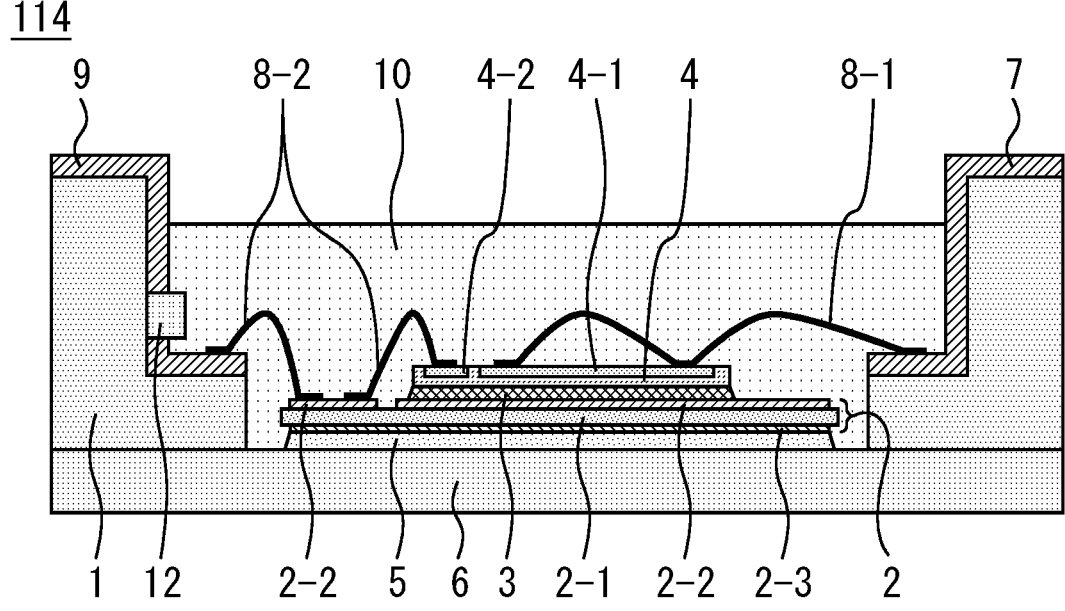
FIG. 8 is a cross-sectional view illustrating a semiconductor apparatus according to a fourth embodiment of the present disclosure.

FIG. 8 is a cross-sectional view illustrating a semiconductor apparatus according to a fourth embodiment of the present disclosure. A semiconductor apparatus 114 is different from the semiconductor apparatus 110 in that the radio tag 11 is not provided.

The semiconductor apparatus 114 includes the radio tag 12. The radio tag 12 stores authenticity determination information in addition to the individual identification information of the semiconductor apparatus. The authenticity determination information is a character string determined based on information that is known only by a manufacturer of the semiconductor apparatus. More specifically, the authenticity determination information is information calculated and encrypted based on histories of a date of manufacturing, measurement result, inspection result, and the like collected in processing, assembly, and inspection during manufacture of the semiconductor apparatus. The information may be recorded in a specific step, or may be updated with new information every time the step proceeds.

The authenticity determination information can be utilized for a service using an authenticity determination method of determining whether a product is a regular product. In recent years, distribution of a counterfeit product of the semiconductor apparatus on the market has become a serious problem. Conventionally, in a case where a regular product and a counterfeit product cannot be distinguished based on appearance, confirmation of an internal structure by an X-ray inspection, or analysis with destruction is necessary. In contrast, in the semiconductor apparatus according to the present embodiment, the individual identification information and the authenticity determination information are recorded in the radio tag 12. Therefore, it is determined whether the product is the regular product by collating the information recorded in the radio tag 12 with the information recorded by the manufacturer of the semiconductor apparatus.

A more specific authenticity determination method is described. First, the individual identification information and the authenticity determination information are read from the radio tag 12. For example, the radio tag reader is used to read the information from the radio tag 12.

Next, the information recorded by the manufacturer of the semiconductor apparatus is read from a database. Finally, the individual identification information and the authenticity determination information are collated with the information recorded in the database to determine authenticity of the semiconductor apparatus.

Further, a password to lock rewriting of the tag information of the radio tag 12 may be a character string determined based on information that is known only by the manufacturer of the semiconductor apparatus. In other words, as with the authenticity determination information, the password may be a character string calculated and encrypted based on histories of manufacture and inspection of the semiconductor apparatus. This further ensures the determination whether the product is the regular product.

In the present embodiment, the configuration including only the radio tag 12 is described; however, the radio tag 11 may be provided together. In this case, effects similar to the effects by the second embodiment can be achieved. Further, in the present embodiment, the semiconductor apparatus using the housing as in the first embodiment is illustrated and described; however, the present embodiment may be applied to the semiconductor apparatus using the metal frame as described in the third embodiment.

In the present disclosure, the modes of the semiconductor apparatuses each including the radio tag are described; however, similar effects are achievable in the unit and the final product using any of the semiconductor apparatuses. For example, in a power conversion apparatus using any of the above-described es, the radio tag can be utilized for individual management and progress management in the manufacturing process.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2022-187600, filed on Nov. 24, 2022 including specification, claims, drawings and summary, on which the Convention priority of the present application is based, are incorporated herein by reference in its entirety.

The invention claimed is:

1. A semiconductor apparatus, comprising:
a housing;
sealing material filling the housing;
a semiconductor chip installed in the housing, surrounded by the housing, and sealed by sealing the sealing material; and
a first radio tag separate from the semiconductor chip and installed on the housing,
the first radio tag being installed in a state where rewriting from outside is not limited,
wherein the semiconductor chip includes a main electrode and a signal electrode formed on a surface, the semiconductor apparatus comprises
a main terminal connected to the main electrode, and
a signal terminal connected to the signal electrode, and
the first radio tag is installed at a position closer to the signal terminal than the main terminal.

2. The semiconductor apparatus according to claim 1, wherein the first radio tag is installed on an inner wall of the housing or in a first radio tag mounting portion formed in the inner wall.

3. The semiconductor apparatus according to claim 1, wherein the first radio tag is installed on a beam formed on the housing.

4. The semiconductor apparatus according to claim 3, wherein the first radio tag is installed in a second radio tag mounting portion formed in the beam.

5. The semiconductor apparatus according to claim 1, wherein the first radio tag is installed inside the housing.

6. The semiconductor apparatus according to claim 1, further comprising:
a second radio tag configured to store individual identification information of the semiconductor apparatus, rewriting of the second radio tag being limited.

7. A power conversion apparatus comprising:
an inverter or power converter including the semiconductor apparatus according to claim 1.

8. A semiconductor apparatus, comprising:
a sealing material made of an insulation resin;
a metal frame at least partially arranged inside the sealing material;
a semiconductor chip arranged on the metal frame; and
a first radio tag separate from the semiconductor chip and arranged on a surface of the metal frame,
the first radio tag being installed in a state where rewriting from outside is not limited,
wherein the semiconductor chip includes a main electrode and a signal electrode formed on a surface,
the semiconductor apparatus comprises
a main terminal connected to the main electrode, and
a signal terminal connected to the signal electrode, and
the first radio tag is installed at a position closer to the signal terminal than the main terminal.

9. The semiconductor apparatus according to claim 8, further comprising:
a second radio tag configured to store individual identification information of the semiconductor apparatus, rewriting of the second radio tag being limited.

10. A power conversion apparatus comprising:
an inverter or power converter including the semiconductor apparatus according to claim 8.

11. A semiconductor apparatus, comprising:
a housing;
sealing material filling the housing;
a semiconductor chip installed in the housing, surrounded by the housing, and sealed by sealing the sealing material; and
a radio tag separate from the semiconductor chip and installed on the housing,
the radio tag being configured to store individual identification information of the semiconductor apparatus and being installed in a state where rewriting from outside is limited,
wherein the semiconductor chip includes a main electrode and a signal electrode formed on a surface,
the semiconductor apparatus comprises
a main terminal connected to the main electrode, and
a signal terminal connected to the signal electrode, and the radio tag is installed at a position closer to the signal terminal than the main terminal.

12. The semiconductor apparatus according to claim 11, wherein the radio tag stores, in addition to the individual identification information of the semiconductor apparatus, authenticity determination information as a character string determined based on information known only by a manufacturer of the semiconductor apparatus.

13. The semiconductor apparatus according to claim 12, wherein writing of the radio tag is locked by a password as a character string determined based on information known only by the manufacturer of the semiconductor apparatus.

14. An authenticity determination method using the semiconductor apparatus according to claim 12, the method comprising:

reading the individual identification information and the authenticity determination information from the radio tag;

reading, from a database, recorded information recorded by the manufacturer; and determining authenticity of the semiconductor apparatus by collating the individual identification information and the authenticity determination information with the recorded information.

15. A power conversion apparatus comprising:

an inverter or power converter including the semiconductor apparatus according to claim 11.

16. A semiconductor apparatus, comprising:

a sealing material made of an insulation resin;

a metal frame at least partially arranged inside the sealing material;

a semiconductor chip arranged on the metal frame; and a radio tag separate from the semiconductor chip and arranged on a surface of the metal frame, the radio tag being configured to store individual identification information of the semiconductor apparatus and being installed in a state where rewriting from outside is limited, wherein the semiconductor chip includes a main electrode and a signal electrode formed on a surface, the semiconductor apparatus comprises a main terminal connected to the main electrode, and a signal terminal connected to the signal electrode, and the radio tag is installed at a position closer to the signal terminal than the main terminal.

17. The semiconductor apparatus according to claim 16, wherein the radio tag stores, in addition to the individual identification information of the semiconductor apparatus, authenticity determination information as a character string determined based on information known only by a manufacturer of the semiconductor apparatus.

18. A power conversion apparatus comprising:

an inverter or power converter including the semiconductor apparatus according to claim 16.

* * * * *